(12) United States Patent
Becker et al.

(10) Patent No.: US 9,198,282 B2
(45) Date of Patent: Nov. 24, 2015

(54) PRINTED CIRCUIT BOARD

(75) Inventors: Robert Charles Becker, Eden Prairie, MN (US); Bruce W. Anderson, Andover, MN (US)

(73) Assignee: Honeywell International Inc., Morris Plains, NJ (US)

( * ) Notice: Subject to any disclaimer, the term of this patent is extended or adjusted under 35 U.S.C. 154(b) by 190 days.

(21) Appl. No.: 13/531,753

(22) Filed: Jun. 25, 2012

(65) Prior Publication Data

US 2013/0341075 A1   Dec. 26, 2013

(51) Int. Cl.
| H05K 1/03 | (2006.01) |
| H05K 1/18 | (2006.01) |
| H05K 1/02 | (2006.01) |
| H05K 3/00 | (2006.01) |
| H05K 3/28 | (2006.01) |

(52) U.S. Cl.
CPC ............ *H05K 1/0281* (2013.01); *H05K 3/0064* (2013.01); *H05K 3/284* (2013.01); *H05K 1/189* (2013.01)

(58) Field of Classification Search
CPC ... H05K 1/0277; H05K 1/0278; H05K 1/028; H05K 1/0281; H05K 1/0306; H05K 1/0353; H05K 1/11; H05K 1/111; H05K 1/118; H05K 1/18; H05K 1/181; H05K 1/182; H05K 1/183; H05K 1/184; H05K 1/185; H05K 1/189; H05K 3/0064; H05K 3/284
USPC ................. 174/250, 255, 254, 256, 260
See application file for complete search history.

(56) References Cited

U.S. PATENT DOCUMENTS

| 6,288,343 | B1 * | 9/2001 | Ahn et al. ............... 174/254 |
| 7,910,156 | B2 * | 3/2011 | Card et al. .............. 427/97.7 |
| 2001/0052647 | A1 * | 12/2001 | Plepys et al. ............ 257/738 |
| 2008/0136045 | A1 * | 6/2008 | Tan et al. ............... 257/777 |
| 2011/0061903 | A1 * | 3/2011 | Sahara et al. ........... 174/254 |
| 2012/0024583 | A1 * | 2/2012 | Lee et al. ............... 174/260 |

* cited by examiner

*Primary Examiner* — Timothy Thompson
*Assistant Examiner* — Paul McGee, III
(74) *Attorney, Agent, or Firm* — Schwegman Lundberg & Woessner, P.A.

(57) ABSTRACT

Apparatuses and methods include a printed circuit board having a flexible circuit material, a rigid material over the flexible circuit material, and a first opening extending from a top surface of the rigid material to a first circuit layer of the flexible circuit material, and wherein the rigid material acts as a stiffener for the flexible circuit material.

14 Claims, 4 Drawing Sheets

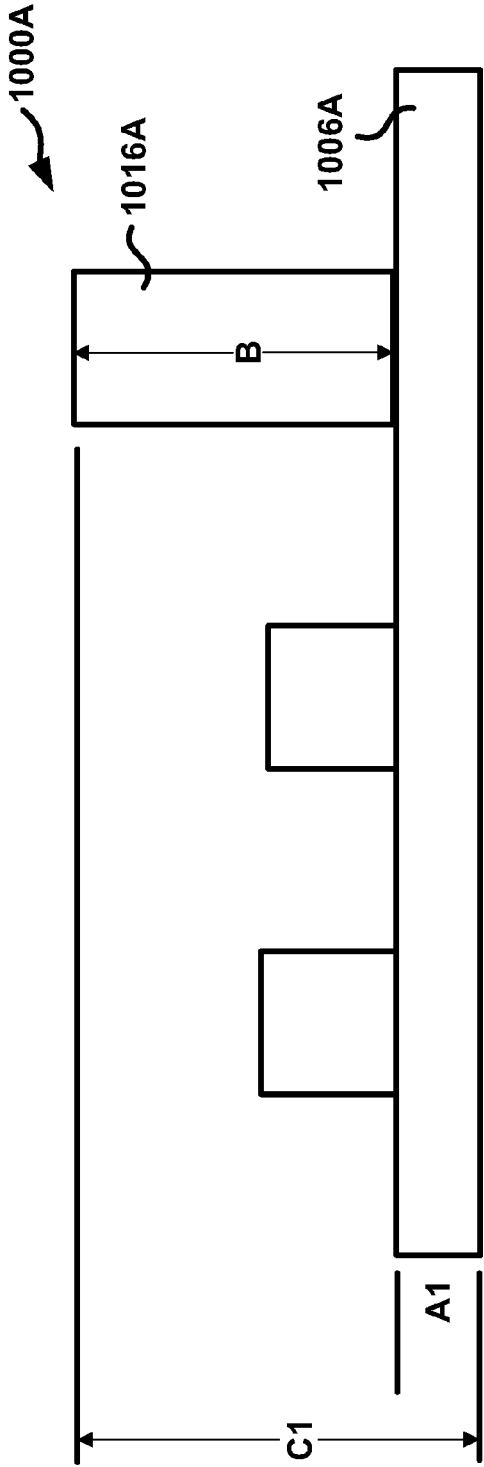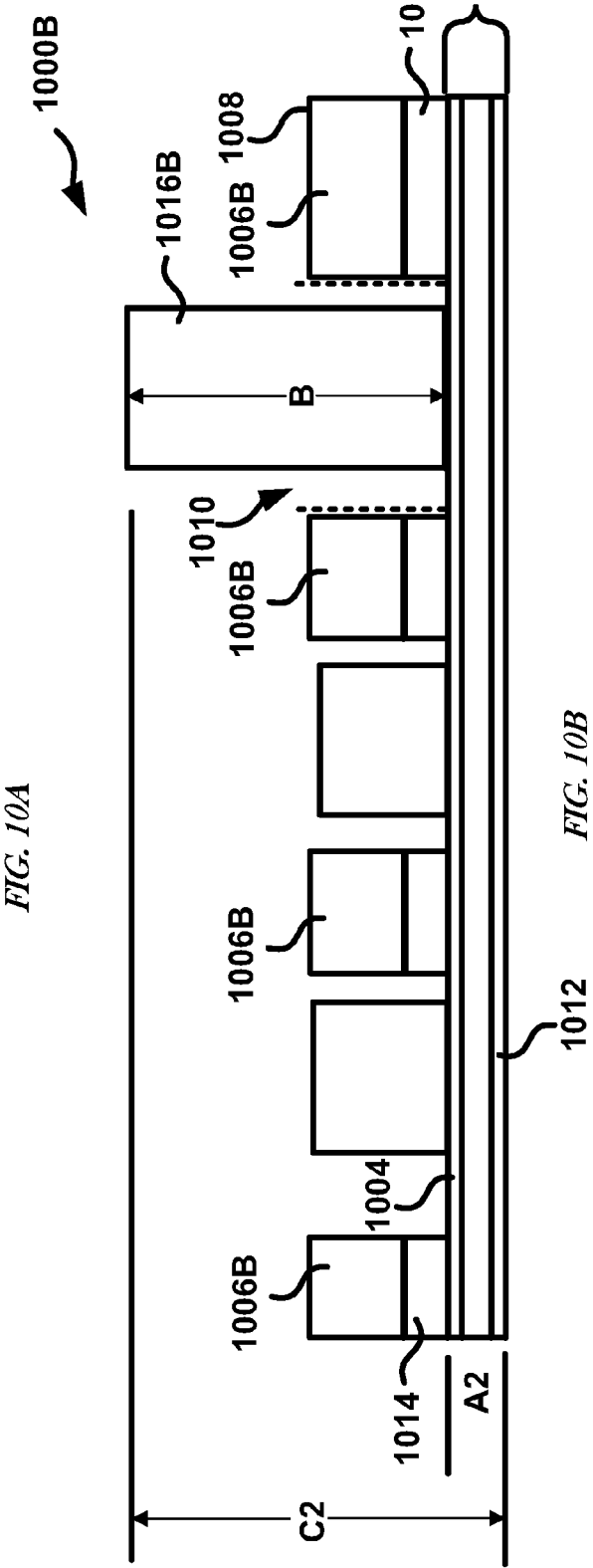

PRINTED CIRCUIT BOARD

BACKGROUND

Prior attempts at relatively thin printed circuit board (PCB) technology result in boards that are either too flexible or too rigid for certain applications, and may also have an undesirable overall thickness. Certain PCBs may also be cost prohibitive due to the materials that are used in creating the PCBs.

SUMMARY

An example printed circuit board includes a flexible circuit material, a rigid material over the flexible circuit material, and a first opening in the rigid material extending from a top surface of the rigid material to a first circuit layer of the flexible circuit material, and wherein the rigid material acts as a stiffener for the flexible circuit material.

In a further example, a method of making a printed circuit board includes depositing an adhesive on a flexible circuit material, depositing a rigid material on the adhesive, and removing a portion of the rigid material to create a first opening extending from a top surface of the rigid material to a first circuit layer of the flexible circuit material, wherein the rigid material increases the rigidity of the printed circuit board.

In some examples, a printed circuit board includes a kapton circuit, an adhesive material on the kapton circuit, an unclad FR-4 material on the adhesive material, and a plurality of openings in the unclad FR-4 material and the adhesive material, wherein the plurality of openings provides the printed circuit board with a specified mechanical flexure characteristic.

BRIEF DESCRIPTION OF THE DRAWINGS

FIG. 10A is a cross-section view of a single layer printed circuit board.

FIG. 10B is a cross-section view of a printed circuit board according to an example embodiment.

DETAILED DESCRIPTION

Figure 1:
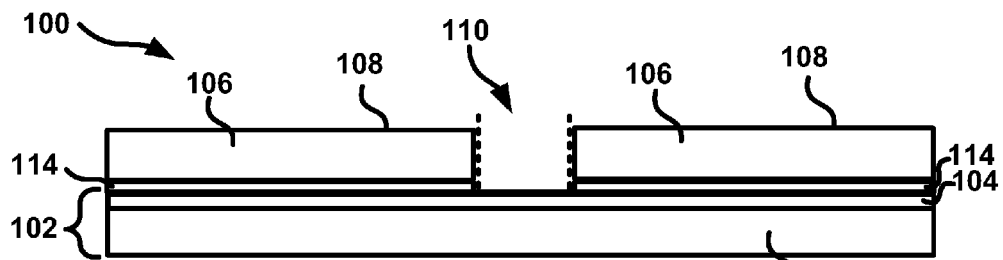
FIG. 1 is a cross-section view of a printed circuit board according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Deploying printed circuit boards in various environments may be better served by employing printed circuit boards with different rigidities. For example, a problem in deploying printed circuit boards in flat and curved surfaces may be that the thickness of the printed circuit board and its associated circuitry results in a printed circuit board that is too thick and may cause a snag hazard. In some examples, the thickness of the printed circuit board and its associated components may be sufficiently thick to catch on objects passing by such as vehicle or pedestrian traffic. If the sensor is deployed in a curved surface, conventional rigid materials such as FR-4 may be insufficiently flexible to conform to the curved surface. Also, flexible circuit materials such as thin polyimide like kapton may be so flexible they present difficulties in manufacturing. Circuit board materials may also be cost prohibitive. What is desired is a cost-effective printed circuit board with intermediate flexibility characteristics and that is sufficiently thin to help reduce snagging passing objects.

By adhering a rigid or semi-rigid material (hereinafter rigid material) to a flexible circuit material and then removing a portion of the rigid material to create an opening to a first circuit layer of the flexible circuit material the rigidity of the printed circuit board can be increased compared to the rigidity of the flexible circuit material. An electrical component can be inserted in the opening and connected to the flexible circuit material. By inserting the electrical component in the opening the overall thickness profile of the printed circuit board may be decreased as compared with a typical single layer circuit board that includes an electrical component with the same height (dimension). The opening may also provide protection for the electrical component inserted therein as the electrical component is at least partially recessed into the opening in the rigid material. Using the rigid material may also make the printed circuit board more planar and thereby improve circuit board yields with certain manufacturing techniques. Using a rigid material in the making of the printed circuit board may make the board more amenable to manufacturing with less complex and less expensive equipment when compared with manufacturing thin printed circuit boards such as a kapton printed circuit board.

FIG. 1 is a depiction of a printed circuit board (PCB) 100 according to an example embodiment. The PCB 100 may include a flexible circuit material 102 and a rigid material 106.

The flexible circuit material 102 may include a first circuit layer 104 and an intermediate layer 128. The flexible circuit material 102 may include a polyimide such as kapton, polyether ether ketone, conductive polyester, any other flexible circuit material, or any combination thereof. In the illustrated example, the flexible circuit material 102 is a single layer flexible circuit material. In certain examples, the flexible circuit material 102 is a two layer flexible circuit. In other examples, the flexible circuit material 102 is a flexible circuit with more than two layers. In certain examples, a circuit layer such as a first circuit layer 104 may include a conductive trace, solder pad, via, etc. The first circuit layer 104 may be operable to have electrical components affixed thereto. In some examples, flexible circuit material 102 may be a kapton circuit board.

The rigid material 106 may be attached to the flexible circuit material 102 by an adhesive layer 114. In certain examples, the rigid material 106 may be a dielectric. The rigid material may include glass-reinforced epoxy such as FR-4, polytetrafluorethylene (Teflon), cotton-paper reinforced epoxy (CEM-3), phenolic-glass (G3), paper-phenolic (FR-1 or FR-2), polyester-glass (CEM-5), any other sufficiently rigid dielectric material, or any combination thereof. In certain examples, the rigid material may include unclad FR-4 (FR-4 without copper traces, vias, or the like). An opening 110 may be formed in the rigid material 106. The opening 110 may extend from a top surface 108 of the rigid material 106 to the first circuit layer 104 of the flexible circuit material 102. In certain examples, the opening 110 decreases the rigidity (increases the flexibility) of the printed circuit board with respect to the rigidity of a rigid printed circuit board such as an FR-4 PCB without an opening. In certain examples, depositing the rigid material 106 over the flexible circuit material may increase the rigidity (decrease the flexibility) of the PCB with respect to the rigidity of a flexible printed circuit board such as a kapton PCB without rigid material adhered thereto. In some examples, the rigid material 106 may include a rigid material layer. In some examples, the rigid material layer may be an unclad FR-4 material layer.

The adhesive 114 may be operable to bond the flexible circuit material 102 to the rigid material 106. In certain examples, the adhesive 114 includes a fiberglass cloth insulator impregnated with an epoxy resin, other types of adhesive, or a combination thereof.

Figure 2:
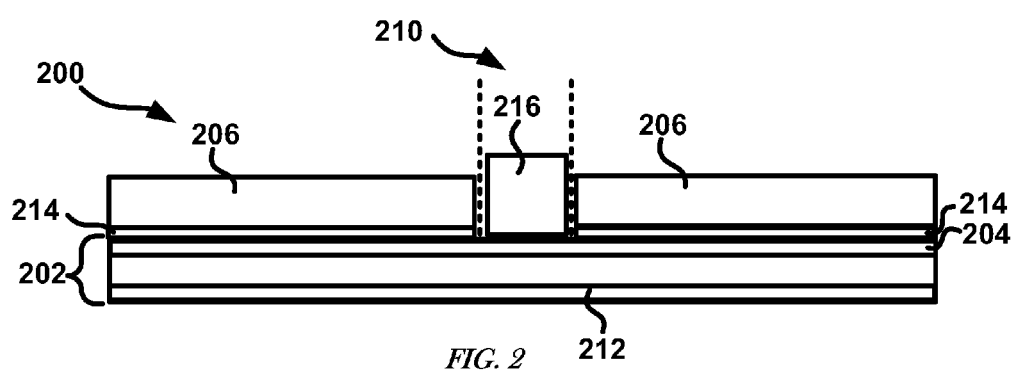
FIG. 2 is a cross-section view of another printed circuit board according to an example embodiment.

FIG. 2 is a depiction of a PCB 200 according to an example embodiment. PCB 200 may be substantially similar to PCB 100 of FIG. 1 with flexible circuit material 202 including a second circuit layer 212 and an electrical component 216 placed in an opening 210 (indicated by the dashed lines) in rigid material 206 and adhesive material 214. The second circuit layer 212 may be operable to have electrical components affixed thereto. In certain examples, both the first and second circuit layers 204 and 212 do not include any electrical components affixed thereto prior to adhering the rigid material 206 to the flexible circuit material 202.

Placing the electrical component 216 in the opening 210 may provide protection for the electrical component since it is at least partially recessed into the rigid material 206. In certain examples, the electrical component 216 may be connected to the first circuit layer 204 of the flexible circuit material 202. The connection may be a solder connection, or other type of electrical connection. In certain examples, the electrical component 216 is a surface mount component. In other examples, the electrical component 216 is a die. The die may include a wire connected to a pad on the top surface of the die and to the first circuit layer of the flexible circuit material 202.

In certain examples, opening 210 may be sized and shaped so as to be large enough to insert an electrical component into the opening. In some examples, opening 210 may be sized and shaped to achieve a specified mechanical flexure characteristic for printed circuit board 200. In some examples, multiple openings may be employed to achieve a specified mechanical flexure characteristic for a printed circuit board. In certain examples, the portion of opening 210 that corresponds to an opening in rigid material 206 is created prior to adhering the rigid material 206 to the flexible circuit material 202. That is, openings may be formed in rigid material 206 prior to affixing the rigid material 206 to flexible circuit material 202 or after affixing the flexible circuit material 202 to the rigid material 206. In examples where the rigid material includes openings prior to adhering the rigid material to the flexible circuit material, an excess adhesive removal technique may be employed to remove adhesive that flows into the opening in rigid material during the process of adhering the rigid material to the flexible circuit material. Such a process may include etching, milling, drilling, wet chemistry, some other type of adhesive removal process, or a combination thereof. In certain examples, a printed circuit board may include a plurality of openings to provide the printed circuit board with a specified mechanical flexure characteristic. In these examples, the plurality of openings may be shaped and sized so as to provide a printed circuit board with more or less flexibility.

Figure 3:
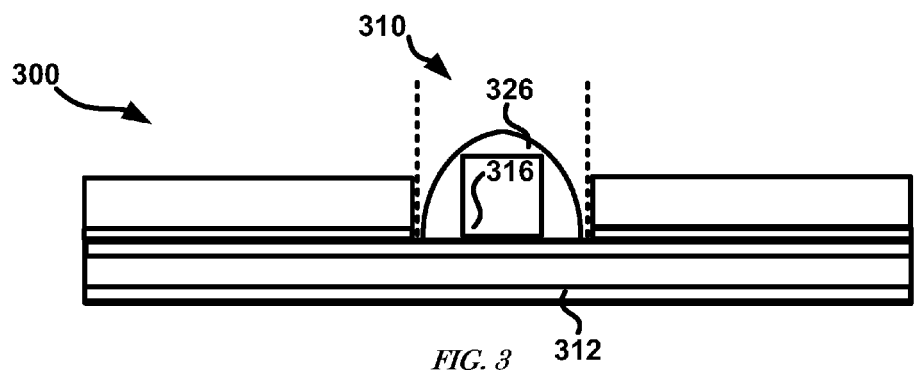
FIG. 3 is a cross-section view of another printed circuit board according to an example embodiment.

FIG. 3 is a depiction of a PCB 300 according to an example embodiment. PCB 300 may be substantially similar to PCB 200 of FIG. 2 with PCB 300 including a protective material 326 covering electrical component 316. In certain examples, the protective material 326 may be deposited in opening 310. In certain examples, the electrical component 316 is covered in a protective material including an epoxy resin. In some examples, the protective material 326 may protect the electrical component from damage due to the surrounding environment. In some examples, the protective material 326 may be opaque so as to inhibit light from impinging on a light sensitive component such as a bare integrated circuit die.

Figure 4:
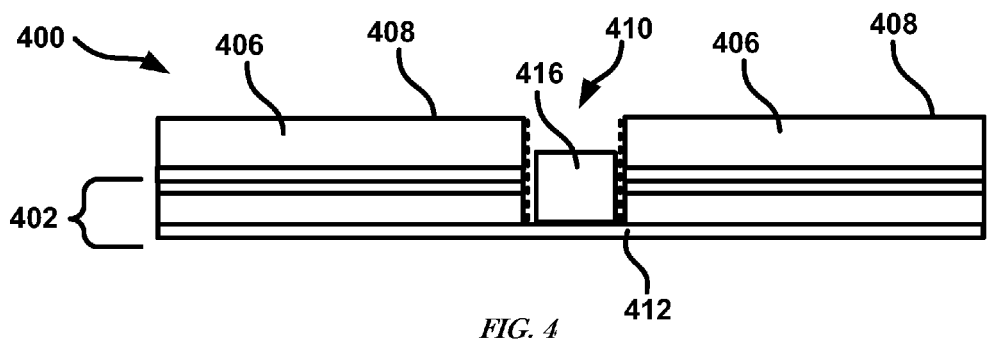
FIG. 4 is a cross-section view of another printed circuit board according to an example embodiment.

FIG. 4 is a depiction of a PCB 400 according to an example embodiment. PCB 400 may be substantially similar to PCB 300 of FIG. 3 with PCB 400 including an electrical component 416 inserted (e.g. placed or deposited) in an opening 410 extending from a top surface 408 of the rigid material 406 to a second circuit layer 412 of the flexible circuit material 402. Opening 410 may be formed using a milling, drilling, reactive ion etching, wet chemistry, other opening forming process, or any combination thereof. In certain examples, an opening may be formed by removing rigid material and adhesive and then reactive ion etching the flexible circuit material to the second circuit layer of the flexible circuit material.

Figure 5:
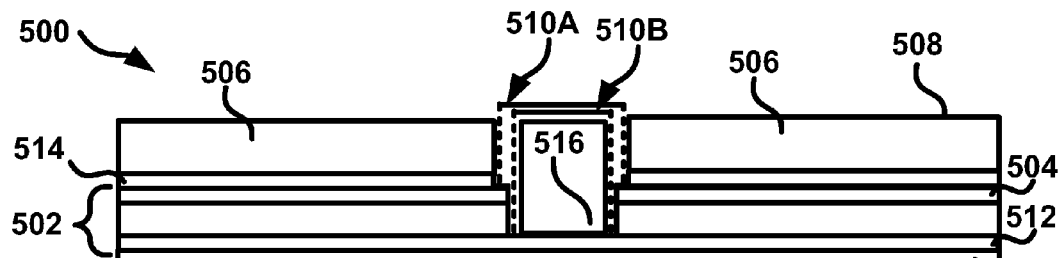
FIG. 5 is a cross-section view of another printed circuit board according to an example embodiment.

FIG. 5 is a depiction of a PCB 500 according to an example embodiment. PCB 500 may be substantially similar to PCB 400 of FIG. 4 with PCB 500 including an opening 510A in the rigid material 506 and adhesive 514 that is wider than an opening 510B in the flexible circuit material, and a dielectric layer 522. In certain examples, the openings with different widths may allow an electrical component 516 to be placed on second circuit layer 512 and connected to first circuit layer 504. In certain examples, the electrical component 516 may be electrically connected to both first and second circuit layers 504 and 512.

PCB 500 may include the dielectric layer 522. The dielectric layer 522 may provide mechanical stability for PCB 500. The dielectric layer 522 may also provide mechanical stability for electrical components placed in an opening such as opening 510B. The dielectric layer 522 may provide protection from the surrounding environment for second circuit layer 512.

Figure 6:
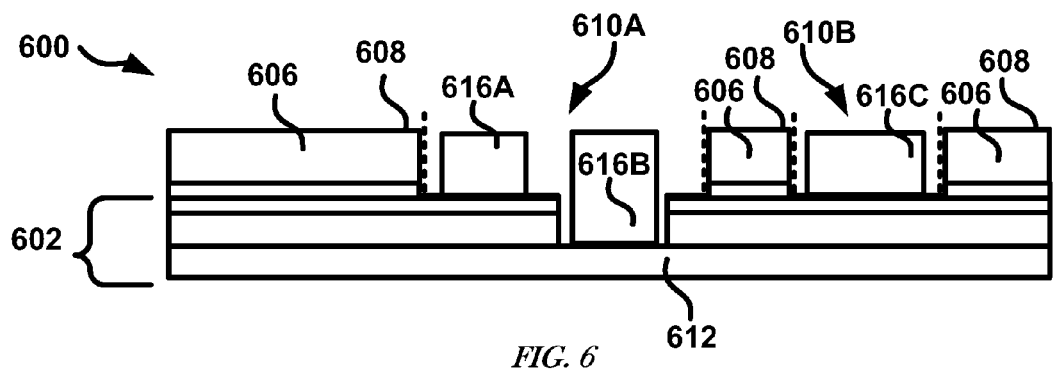
FIG. 6 is a cross-section view of another printed circuit board according to an example embodiment.

FIG. 6 is a depiction of a PCB 600 according to an example embodiment. PCB 600 may be substantially similar to PCB 500 with PCB 600 including multiple openings 610A and 610B wherein each opening 610A and 610B includes at least one electrical component 616A, 616B, or 616C disposed therein. In certain examples, openings in PCB 600 may extend from a top surface 608 of rigid material 606 to the first circuit layer of flexible circuit material 602 or to the second circuit layer 612 of flexible circuit material 602. If a flexible circuit material of more than two layers is included in a printed circuit board then openings may be made to any layer of the flexible circuit material. In some examples, PCB 600 may include a second circuit layer 612 that may be thicker than typical so as to provide mechanical stability for electrical components placed thereon. In some examples, a PCB may include stamped metal (e.g. copper) adhered (e.g. soldered) to parts of the PCB to create a layer that is thicker than typical. The stamped metal may be on any surface of a PCB (e.g. top or bottom surfaces). In some examples, the stamped metal may be help dissipate heat and may aid heat conduction. In certain examples, including a thicker second circuit layer may replace including a dielectric layer such as the dielectric layer 522 of PCB 500.

Figure 7:
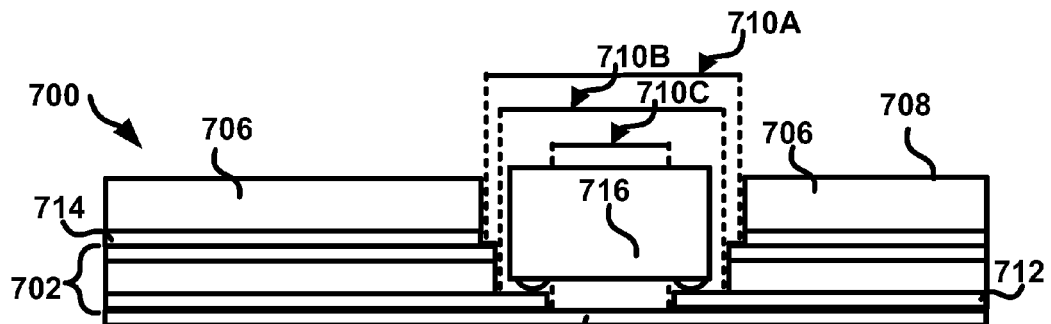
FIG. 7 is a cross-section view of another printed circuit board according to an example embodiment.

FIG. 7 is a depiction of a PCB 700 according to an example embodiment. PCB 700 may be substantially similar to PCB 600 of FIG. 6 with PCB 700 including an electrical component 716 attached to second circuit layer 712 of flexible circuit material 702 with a flip-chip method of attachment and including a dielectric layer 722. In certain examples, an opening 710A may extend from a top surface 708 of rigid material 706 to a first circuit layer 704. In certain examples, an opening 710B may extend from a top surface 708 of rigid material 706 to the second circuit layer 712. In certain examples, an opening 710C may extend from a top surface 708 of rigid material 706 through the second circuit layer 712 (each opening in FIG. 7 indicated by dashed lines connected by a solid cross bar). If a flexible circuit material of more than two layers is included in a PCB then openings may be etched, drilled, or milled through the rigid material and adhesive layer to any of the layers of the flexible circuit material including etching, drilling, or milling an opening all the way through the rigid material, adhesive material, and flexible circuit material.

Figure 8:
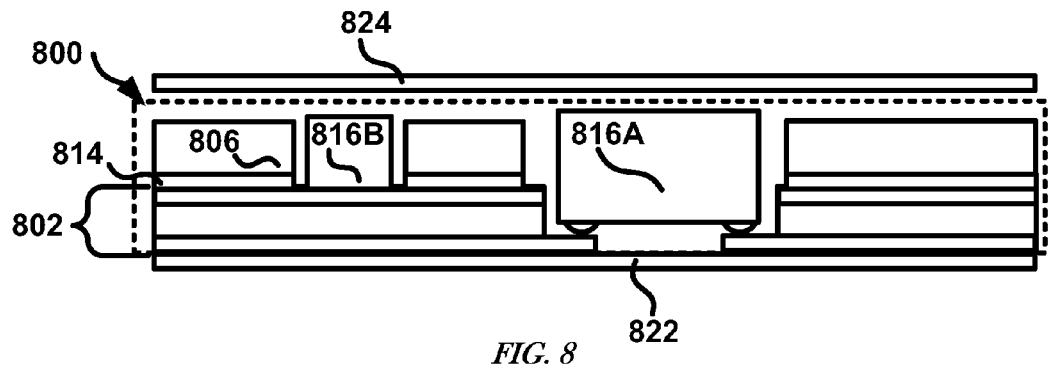
FIG. 8 is a cross-section view of another printed circuit board according to an example embodiment.

FIG. 8 is a depiction of a PCB 800 according to an example embodiment. PCB 800 may be substantially similar to PCB 700 of FIG. 7 with PCB 800 including multiple electrical components 816A and 816B each placed in separate openings and including a protective cover 824 over PCB 800. The protective cover 824 and the dielectric layer 822 may be incorporated into a package such that protective cover 824 is the top of the package and dielectric layer 822 is the bottom of the package. In certain examples, electrical component 816A may be a flip-chip component. In certain examples, electrical component 618B may be a surface mount component, an integrated circuit die, or other electrical component.

Figure 9:
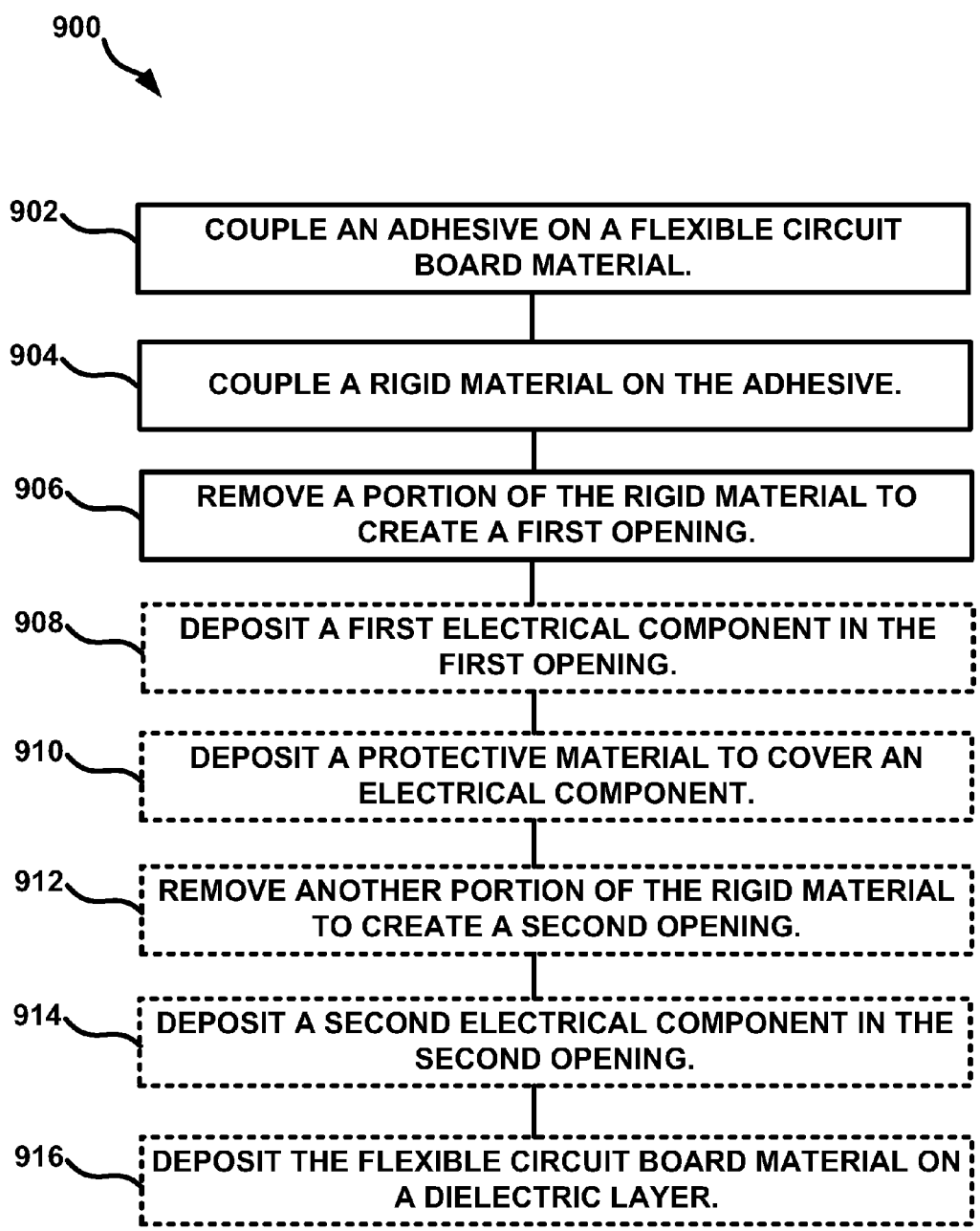
FIG. 9 is a flow diagram of a method of making a printed circuit board according to an example embodiment.

FIG. 9 is a depiction of a method of making a printed circuit board 900 according to an example embodiment. Dashed boxes indicate optional acts. Method 900 may include coupling an adhesive on a flexible circuit material at 902. In certain examples, the flexible circuit material and adhesive are substantially similar to the flexible circuit material and adhesive of FIGS. 1-8. A rigid material may be coupled to the adhesive at 904. The rigid material may be substantially similar to the rigid material of FIGS. 1-8. In certain examples, the rigid material may substantially cover all of the flexible circuit material before any rigid material is removed. A portion of the rigid material may be removed to create a first opening at 906. The first opening may be substantially similar to an opening of FIGS. 1-8. In certain examples, the opening increases the flexibility of the printed circuit board as compared to the printed circuit board without the opening. A first electrical component may be deposited in the first opening at 908. The first electrical component may be substantially similar to an electrical component included in FIGS. 2-8. A protective material may be deposited over an electrical component at 910. The protective material may be substantially similar to protective material discussed with regard to FIG. 3. Another portion of the rigid material may be removed to create a second opening at 912. A second electrical component may be deposited in the second opening. The second electrical component may be substantially similar to an electrical component included in FIGS. 2-8. The flexible circuit material may be deposited on a dielectric layer at 916. In certain examples, the dielectric layer may be a piece of plastic, polymer, or other sufficiently rigid and protective non-conducting material. In certain examples, the dielectric layer is the bottom of a package in which the printed circuit board is contained within.

FIG. 10A is a depiction of a single layer circuit board 1000A. The single layer circuit board 1000A may include an electrical component 1016A and a rigid material 1006A. In certain examples, the rigid material 1006A may be an FR-4 laminate. In the examples, where the rigid material 1006A is an FR-4 laminate the dimension A1, corresponding to thickness of the rigid material 1006A, may be between about 0.008 and 0.009 inches. If another rigid material were included the dimension A1 may be different. In certain examples, the electrical component may be a surface mount part that includes a dimension B, corresponding to height of component 1016A. In the examples where the electrical component is a surface mount part, the dimension B may be about 0.036 inches. If another electrical component were included the dimension B may be different. Dimension C1 corresponds to the thickness of single layer circuit board 1000A (the combined thickness A1 and height B). In the examples where electrical component 1016A is a surface mount part and the rigid material 1006A is an FR-4 laminate dimension single layer circuit board thickness C1 may be between about 0.044 and 0.045 inches. Dimension C1 may differ by using different electrical components and rigid material.

FIG. 10B is a depiction of a printed circuit board 1000B according to an example embodiment. The printed circuit board 1000B may include a flexible circuit material 1002, a rigid material 1006B adhered to the flexible circuit board material 1002 with an adhesive layer 1014, at least one opening 1010 in the rigid material 1006B and adhesive layer 1014, the opening in the illustrated example extends from a top surface 1008 of the rigid material 1006B to a first circuit layer 1004 of the flexible circuit material 1002, and at least one electrical component 1016B placed in opening 1010.

In certain examples, the flexible printed circuit board material 1002 may include a printed circuit board material thickness A2. In certain examples, the flexible printed circuit board material may be a two layer kapton printed circuit board material with a thickness A2 between about 0.003 and 0.005 inches. In examples where the electrical component 1016B is a surface mount part with height B of about 0.036 inches that is placed on the first circuit layer 1004 the thickness C2 of printed circuit board 1000B may be between about 0.039 and 0.041 inches. As compared to an example single layer printed circuit board such as the single layer printed circuit board 1000A of FIG. 10A, the printed circuit board 1000B of FIG. 10B may be about 0.005 inches shorter (less thick). Also, the printed circuit board 1000B may be more flexible than single layer printed circuit board 1000A since the printed circuit board 1000B includes flexible circuit material 1002 and at least one hole 1010 in the rigid material 1006B.

In certain examples, the reduction in thickness may improve the ability of the printed circuit board to avoid snagging on passing objects or be disposed in places that require a printed circuit board with a reduced thickness. In certain examples, the increased flexibility may improve the ability of the printed board to avoid snagging or conform to the contours of a surface which the printed circuit is on.

If other flexible printed circuit board materials or electrical components are included the dimensions A2, B, and C2 may change. In certain examples, the thickness reduction may be increased by making an opening that extends from a top surface of the rigid material 1008 to a second circuit layer 1012 of the flexible circuit material 1002 and placing electrical component 1016B in that opening. Other ways to reduce the thickness of a printed circuit board should be appreciated by understanding this disclosure.

ADDITIONAL NOTES AND EXAMPLES

In Example 1, a printed circuit board includes a flexible circuit material, a rigid material over the flexible circuit material, and a first opening in the rigid material extending from a top surface of the rigid material to a first circuit layer of the flexible circuit material, and wherein the rigid material acts as a stiffener for the flexible circuit material.

In Example 2, the flexible circuit material of Example 1 includes a two layer kapton circuit board.

In Example 3, the rigid material of at least one of Examples 1-2 includes unclad FR-4.

In Example 4, the printed circuit board of at least one of Examples 1-3 includes adhesive material between the flexible circuit material and the rigid material to bond the flexible circuit material to the rigid material and wherein the first opening extends from a top surface of the rigid material to a first circuit layer or a second circuit layer of the flexible circuit material.

In Example 5, the printed circuit board of at least one of Examples 1-4 includes an electrical component in the first opening.

In Example 6, the electrical component of at least one of Examples 1-5 is a die including a wire connecting a pad on the top surface of the die to at least one of the first circuit layer and a second circuit layer of the flexible circuit material.

In Example 7, the printed circuit board of at least one of Examples 1-6 comprises a protective material covering the die.

In Example 8, the printed circuit board of at least one of Examples 1-7 includes a second opening extending from a top surface of the rigid material to a second circuit layer of the flexible circuit material.

In Example 9, the printed circuit board of at least one of Examples 1-8 includes an electrical component in the second opening, the electrical component attached to the second circuit layer of the flexible circuit material using a flip-chip attachment.

In Example 10, a method of making a printed circuit board includes coupling an adhesive layer to a flexible circuit material, coupling a rigid material layer to the adhesive layer, and removing a portion of the rigid material layer to create a first opening extending from a top surface of the rigid material to a first circuit layer of the flexible circuit material, wherein the rigid material increases the rigidity of the printed circuit board.

In Example 11, coupling the adhesive of at least one of Examples 1-10 includes depositing an adhesive on a kapton circuit board.

In Example 12, coupling the rigid material to the adhesive layer of at least one of Examples 1-11 includes coupling unclad FR-4.

In Example 13, the method of making a printed circuit board of at least one of Examples 1-12 includes depositing an electrical component in the first opening.

In Example 14, depositing the electrical component of at least one of Examples 1-13 includes depositing a die in the first opening.

In Example 15, the method of making a printed circuit board of at least one of Examples 1-14 includes covering the die with a protective material.

In Example 16, the method of making a printed circuit board of at least one of Examples 1-15 includes removing another portion of the rigid material to create a second opening extending from a top surface of the rigid material to a second circuit layer of the flexible circuit material.

In Example 17, the method of making a printed circuit board of at least one of Examples 1-16 includes depositing an electrical component in the second opening.

In Example 18, depositing the electrical component of at least one of Examples 1-17 includes depositing the electrical component such that the electrical component is attached to the bottom layer of the flexible circuit material using a flip-chip attachment.

In Example 19, a printed circuit board includes a kapton circuit board, an adhesive material layer coupled to the kapton circuit board, an unclad FR-4 material layer coupled to the adhesive material layer, and a plurality of openings in the unclad FR-4 material layer and the adhesive material layer, wherein the plurality of openings provides the printed circuit board with a specified mechanical flexure characteristic.

In Example 20, the printed circuit board of at least one of Examples 1-19 includes an electrical component in the first opening.

In Example 21, the first opening of at least one of Examples 1-20 includes the first opening extending from a top surface of the unclad FR-4 material layer to a first circuit layer of the kapton circuit board.

In Example 22, the first opening of at least one of Examples 1-21 includes the first opening extending from a top surface of the unclad FR-4 material layer to a second circuit layer of the kapton circuit board.

In Example 23, the printed circuit board of at least one of Examples 1-22 includes a cover layer.

In Example 24, the kapton circuit board of at least one of Examples 1-23 is on the cover layer.

In Example 25, the printed circuit board of at least one of Examples 1-24 includes a package including a cover layer.

In Example 26, the kapton circuit board of at least one of Examples 1-25 is disposed in the package.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

What is claimed is:

1. A double-sided printed circuit board comprising:
a single flexible circuit material including only two circuit layers, a first circuit layer and a second circuit layer, wherein the first circuit layer is on a first surface of the flexible circuit material and the second circuit layer is on a second surface of the flexible circuit material, wherein the second surface of the flexible circuit material is opposite the first surface of the flexible circuit material;
an unclad rigid material coupled to the flexible circuit material through an adhesive material on the first surface of the flexible circuit material, wherein the rigid material acts as a stiffener for the flexible circuit material;
a first opening in the rigid material extending from a top surface of the rigid material to the first circuit layer of the flexible circuit material; and
a second opening in the rigid material extending from a top surface of the rigid material to the second circuit layer the flexible circuit material, wherein the second opening includes a generally uniform width from the top surface of the rigid material, through the flexible circuit material, to the second circuit layer, and wherein the second opening is sized and shaped to allow a first electrical component to be situated in the second opening.

2. The printed circuit board of claim 1, wherein the flexible circuit material is a two layer Kapton circuit board and the rigid material is unclad FR-4.

3. The printed circuit board of claim 1, wherein the adhesive material is between the flexible circuit material and the rigid material to bond the flexible circuit material to the rigid material, and wherein the first opening extends from a top surface of the rigid material, through the adhesive material to a first circuit layer of the flexible circuit material.

4. The printed circuit board of claim 1, comprising a second electrical component in the first opening.

5. The printed circuit board of claim 4, wherein the second electrical component is a die including a wire connecting a pad on the top surface of the die to at least one of the first circuit layer and the second circuit layer of the flexible circuit material, and wherein the printed circuit board comprises a protective material covering the die.

6. The printed circuit board of claim 1, comprising the first electrical component in the second opening, the electrical component attached to the second circuit layer of the flexible circuit material using a flip-chip attachment.

7. A double-sided printed circuit board comprising:
a Kapton circuit board including only two circuit layers, a first circuit layer and a second circuit layer separated by a single flexible layer, wherein the first circuit layer is on a first surface of the Kapton circuit board and the second circuit layer is on a second surface of the Kapton circuit board, wherein the second surface of the Kapton circuit board is opposite the first surface of the Kapton circuit board;
an adhesive material layer coupled to the Kapton circuit board on the first circuit layer of the Kapton circuit board;
an unclad FR-4 material layer coupled to the adhesive material layer; and
a plurality of openings in the unclad FR-4 material layer, wherein a first opening of the plurality of openings includes a generally uniform width, is shaped and sized to allow a first electrical component to be situated therein, and extends from a top surface of the FR-4 material layer, through the adhesive material layer, and to the first circuit layer, wherein a second opening of the plurality of openings includes a generally uniform width, is shaped and sized to allow a second electrical component to be situated therein, and extends from a top surface of the FR-4 material layer, through the adhesive material layer, through the flexible layer, and to the second circuit layer, wherein the plurality of openings provides the printed circuit board with a specified mechanical flexure characteristic.

8. The printed circuit board of claim 7, comprising the first electrical component in the first opening of the plurality of openings.

9. The printed circuit board of claim 7, comprising a cover layer, wherein the Kapton circuit board is on the cover layer.

10. The printed circuit board of claim 9, comprising a package including a cover layer, wherein the Kapton circuit board is disposed in the package.

11. The printed circuit board of claim 1, further comprising a flexible dielectric material layer coupled to the second surface of the flexible circuit material to provide mechanical stability to the second circuit layer.

12. The printed circuit board of claim 7, further comprising a flexible dielectric material layer coupled to the second surface of the Kapton circuit board to provide mechanical stability to the second circuit layer.

13. The printed circuit board of claim 1, further comprising:
a dielectric layer on the second circuit layer; and
a third opening concentric with and narrower than the second opening, the third opening extending from the top surface of the rigid material, through the first circuit layer, through the flexible material, and through the second circuit layer to the dielectric layer.

14. The printed circuit board of claim 7, further comprising:
a dielectric layer on the second circuit layer; and
wherein a third opening of the plurality of openings includes a third opening concentric with and narrower than the second opening, the third opening extending from the top surface of the unclad FR-4 material layer, through the first circuit layer, through the flexible layer, and through the second circuit layer to the dielectric layer.

* * * * *